(12) United States Patent
Jeon et al.

(10) Patent No.: US 12,476,234 B2
(45) Date of Patent: Nov. 18, 2025

(54) SEMICONDUCTOR DEVICE INCLUDING THROUGH ELECTRODES

(71) Applicant: Samsung Electronics Co., Ltd., Suwon-si (KR)

(72) Inventors: Hyungjun Jeon, Seoul (KR); Kwangjin Moon, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 518 days.

(21) Appl. No.: 17/891,629

(22) Filed: Aug. 19, 2022

(65) Prior Publication Data
US 2023/0178533 A1   Jun. 8, 2023

(30) Foreign Application Priority Data

Dec. 2, 2021   (KR) .................. 10-2021-0170949

(51) Int. Cl.
*H01L 25/18* (2023.01)
*H01L 23/00* (2006.01)
(Continued)

(52) U.S. Cl.
CPC .......... *H01L 25/18* (2013.01); *H01L 23/3157* (2013.01); *H01L 23/481* (2013.01);
(Continued)

(58) Field of Classification Search
CPC ........... H01L 25/18; H01L 2224/08145; H01L 21/76898; H01L 24/06; H01L 25/0657;
(Continued)

(56) References Cited

U.S. PATENT DOCUMENTS 9,543,276 B2 * 1/2017 Jee ..................... H01L 23/3135
10,861,808 B2 12/2020 Chen et al.
(Continued)

FOREIGN PATENT DOCUMENTS

KR   10-2014-0063271 A   5/2014
KR   10-2021-0110008 A   9/2021

OTHER PUBLICATIONS

Office Action for Korean Application No. 10-2021-0170949 dated Sep. 3, 2025.

*Primary Examiner* — Mamadou L Diallo
(74) *Attorney, Agent, or Firm* — Harness, Dickey & Pierce, P.L.C.

(57) ABSTRACT

A semiconductor package includes a first semiconductor chip including first pads and a first insulating layer, and a second semiconductor chip including second upper pads, a second insulating layer, second lower pads, and through electrodes connecting the second upper pads and the second lower pads to each other. The package includes a third semiconductor chip including third upper pads, an upper barrier layer, a third insulating layer, third lower pads, a lower barrier layer, and dummy electrode structures connecting the third upper pads and the third lower pads to each other. The package includes an encapsulant below the first semiconductor chip to seal at least a portion of each of the
(Continued)

second and third semiconductor chips and cover side surfaces of the third lower pads. The package includes bump structures below the encapsulant and the second and third semiconductor chips.

20 Claims, 10 Drawing Sheets

(51) Int. Cl.
*H01L 23/31* (2006.01)
*H01L 23/48* (2006.01)

(52) U.S. Cl.
CPC .............. *H01L 24/05* (2013.01); *H01L 24/08* (2013.01); *H01L 24/80* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05681* (2013.01); *H01L 2224/05686* (2013.01); *H01L 2224/08145* (2013.01); *H01L 2224/80379* (2013.01)

(58) Field of Classification Search
CPC ....... H01L 2224/80001; H01L 25/0652; H01L 23/3157; H01L 23/481; H01L 24/05; H01L 24/08

See application file for complete search history.

(56) References Cited

U.S. PATENT DOCUMENTS

| | | | |
|---|---|---|---|
| 11,075,145 B2 | 7/2021 | Yu et al. | |
| 11,222,882 B2* | 1/2022 | Kim | ...................... H01L 23/481 |
| 2002/0074641 A1 | 6/2002 | Towle et al. | |
| 2014/0141569 A1 | 5/2014 | Jo et al. | |
| 2014/0332975 A1 | 11/2014 | Raorane et al. | |
| 2018/0053730 A1 | 2/2018 | Shao et al. | |
| 2018/0197837 A1 | 7/2018 | Yu et al. | |
| 2020/0006324 A1* | 1/2020 | Chen | ........................ H01L 24/09 |
| 2020/0135594 A1* | 4/2020 | Lee | ........................ H01L 24/92 |
| 2020/0168550 A1* | 5/2020 | Ryu | .................... H01L 23/5383 |
| 2020/0343218 A1* | 10/2020 | Hu | .......................... H01L 24/80 |
| 2021/0057363 A1 | 2/2021 | Chen et al. | |
| 2021/0118759 A1 | 4/2021 | Yu et al. | |
| 2021/0125967 A1* | 4/2021 | Zhai | .................... H01L 25/0657 |
| 2021/0272930 A1 | 9/2021 | Choi | |
| 2021/0327819 A1* | 10/2021 | Fang | ........................ H01L 24/05 |
| 2022/0093567 A1* | 3/2022 | Kim | ........................ H01L 24/08 |

* cited by examiner

II-II'

III-III'

SEMICONDUCTOR DEVICE INCLUDING THROUGH ELECTRODES

CROSS TO REFERENCE TO RELATED APPLICATIONS

This application claims the benefit of priority to Korean Patent Application No. 10-2021-0170949 filed on Dec. 2, 2021 in the Korean Intellectual Property Office, the disclosure of which is incorporated herein by reference in its entirety.

BACKGROUND

Some example embodiments of the inventive concepts relate to a semiconductor device.

It may be advantageous for semiconductor devices installed in electronic devices to have high performance and high capacity along with miniaturization. In order to implement the same, research and development of semiconductor devices in which semiconductor chips including through silicon vias (TSVs) are stacked in a perpendicular direction have been conducted.

SUMMARY

Some example embodiments of the inventive concepts provide a semiconductor device having improved reliability.

According to some example embodiments of the inventive concepts, a semiconductor package includes a first semiconductor chip including first pads and a first insulating layer surrounding the first pads, and a second semiconductor chip including second upper pads in contact with a first group of the first pads, a second insulating layer surrounding the second upper pads and in contact with the first insulating layer, second lower pads opposite to the second upper pads, and through electrodes connecting the second upper pads and the second lower pads to each other. The package includes a third semiconductor chip including third upper pads in contact with a second group of the first pads, an upper barrier layer extending along lower surfaces and side surfaces of the third upper pads, a third insulating layer surrounding the third upper pads and in contact with the first insulating layer, third lower pads opposite to the third upper pads, a lower barrier layer extending along upper surfaces of the third lower pads, and dummy electrode structures connecting the third upper pads and the third lower pads to each other. The package includes an encapsulant below the first semiconductor chip, where the encapsulant seals at least a portion of each of the second and third semiconductor chips, and covers side surfaces of the third lower pads. The package including bump structures below the encapsulant and the second and third semiconductor chips, and electrically connected to the second lower pads and the third lower pads.

According to some example embodiments of the inventive concepts, a semiconductor device includes a first semiconductor chip including first pads and a first insulating layer surrounding the first pads. The first semiconductor chip has a flat lower surface defined by lower surfaces of the first pads and a lower surface of the first insulating layer. The device includes a second semiconductor chip below the first semiconductor chip, and including through electrodes electrically connected to a first group of the first pads. The second semiconductor chip has a flat upper surface in contact with the lower surface of the first semiconductor chip. The device includes a third semiconductor chip below the first semiconductor chip and spaced apart from the second semiconductor chip, and including dummy electrode structures electrically connected to a second group of the first pads. The third semiconductor chip has a flat upper surface in contact with the lower surface of the first semiconductor chip. The device includes bump structures below the second and third semiconductor chips, and electrically connected to the through electrodes and the dummy electrode structures, the dummy electrode structures having a width greater than a width of the through electrodes.

According to some example embodiments of the inventive concepts, a semiconductor device includes a first semiconductor chip including first pads and a first insulating layer surrounding the first pads. The first semiconductor chip has a flat lower surface provide defined by lower surfaces of the first pads and a lower surface of the first insulating layer. The device includes a second semiconductor chip below the first semiconductor chip, and including through electrodes electrically connected to a first group of the first pads. The second semiconductor chip has a flat upper surface in contact with the lower surface of the first semiconductor chip. The device includes a third semiconductor chip below the first semiconductor chip and spaced apart from the second semiconductor chip, and including dummy electrodes electrically connected to a second group of the first pads. The third semiconductor chip has a flat upper surface in contact with the lower surface of the first semiconductor chip. The device includes bump structures below the second and third semiconductor chips, and electrically connected to the through electrodes and the dummy electrodes. Third semiconductor chip further includes at least one lower pad disposed between the bump structures and the dummy electrodes, and connected to a plurality of the dummy electrodes, and a plurality of upper pads in contact with the first pads of the second group and connected to the plurality of dummy electrodes.

BRIEF DESCRIPTION OF DRAWINGS

Some example embodiments of the inventive concepts may be more clearly understood from the following detailed description, taken in conjunction with the accompanying drawings, in which.

DETAILED DESCRIPTION

Hereinafter, some example embodiments of the inventive concepts will be described as follows with reference to the accompanying drawings.

Figure 1A:
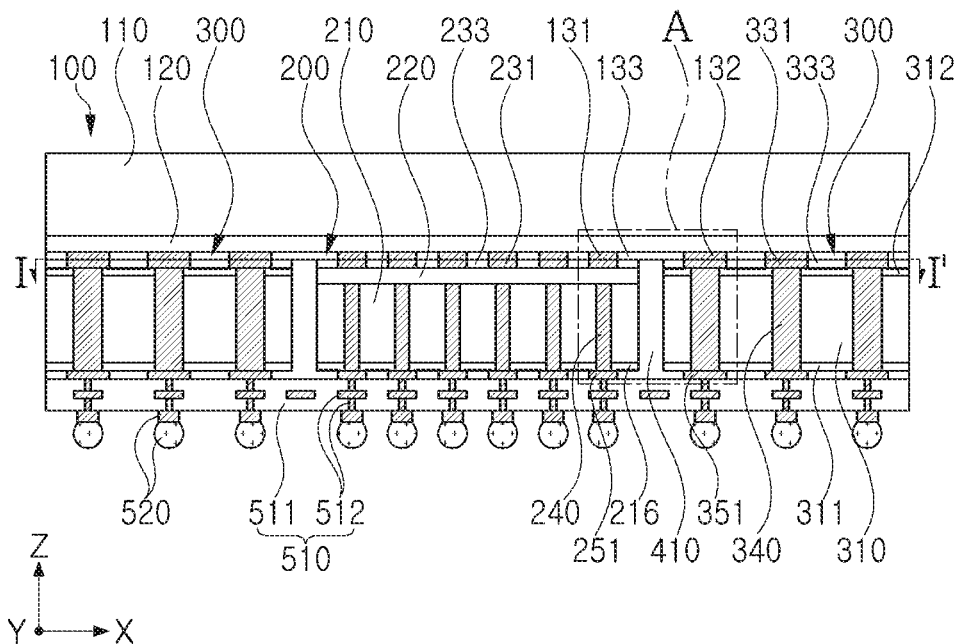
FIG. 1A is a cross-sectional view illustrating a semiconductor device according to an example embodiment of the inventive concepts.
Figure 1B:
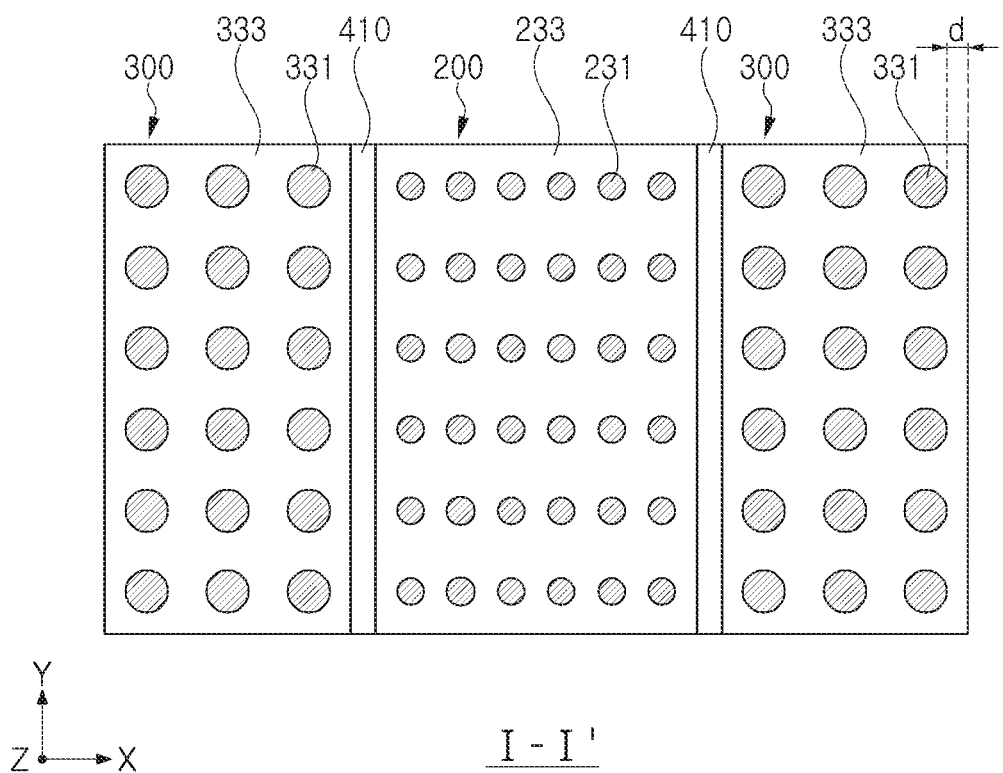
FIG. 1B is a plan view illustrating a cross-section taken along line I-I' of FIG. 1A.
Figure 1C:
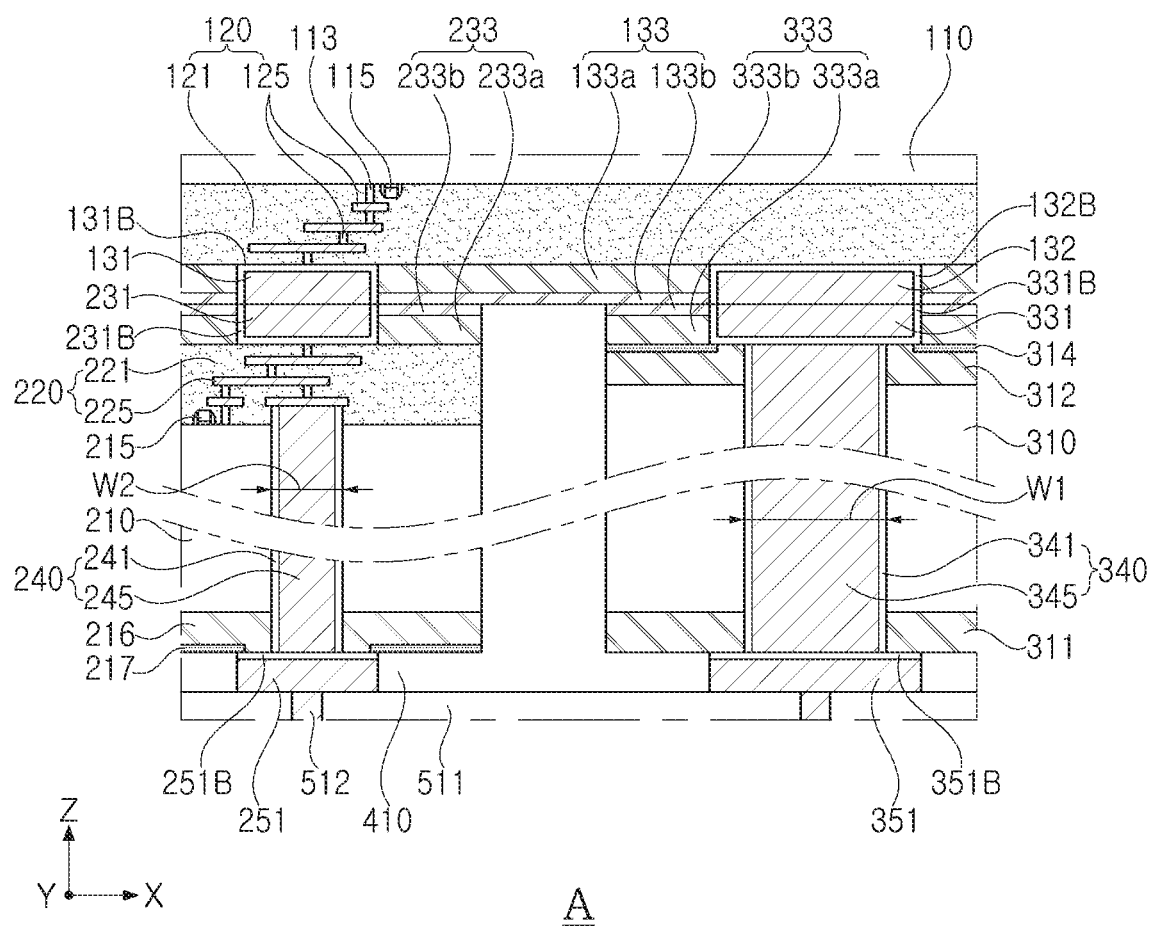
FIG. 1C is a partial enlarged view illustrating region 'A' of FIG. 1A.

FIG. 1A is a cross-sectional view illustrating a semiconductor device 10A according to an example embodiment of the inventive concepts, FIG. 1B is a plan view illustrating a cross-section taken along line I-I' of FIG. 1A, and FIG. 1C is a partial enlarged view illustrating region 'A' of FIG. 1A.

Referring to FIGS. 1A to 1C, the semiconductor device 10A according to an example embodiment may include a first semiconductor chip 100, a second semiconductor chip 200, at least one third semiconductor chip 300, and bump structures 520. According to an example embodiment, the semiconductor device 10A may further include an encapsulant 410 sealing at least a portion of each of the second and third semiconductor chips 200 and 300, and the bump structures 520 and a redistribution structure 510 connecting the bump structures 520 to the second and third semiconductor chips 200 and 300.

According to some example embodiments of the inventive concepts, a signal transmission path between the first semiconductor chip 100 and the second semiconductor chip 200 may be reduced or minimized by bonding an active surface of the first semiconductor chip 100 and an active surface of the second semiconductor chip 200 to each other. The first semiconductor chip 100 may be a logic chip including a logic chip such as a central processor (CPU), a graphic processor (GPU), a field programmable gate array (FPGA), a digital signal processor (DSP), an encryption processor, a microprocessor, a microcontroller, and an analog-to-digital converter, an application specific semiconductor (ASIC), etc., and the second semiconductor chip 200 may be a memory chip including a memory circuit such as DRAM, SRAM, PRAM, MRAM, FeRAM, RRAM, etc., but example embodiments are not limited thereto. For example, the second semiconductor chip 200 may include a cache memory circuit providing cache information to the first semiconductor chip 100.

In addition, heat dissipation characteristics of the semiconductor device 10A may be improved by attaching at least one dummy chip (hereinafter, referred to as a third semiconductor chip 300) to the active surface of the first semiconductor chip 100. The third semiconductor chip 300 may include dummy electrode structures 340 (which may be referred to as 'dummy electrodes') having a width W1 greater than a width W2 through electrodes 240 of the second semiconductor chip 200. Dummy pads (hereinafter, referred to as 'third upper pad' and 'third lower pad') respectively disposed on upper and lower portions of the dummy electrode structures 340 may be formed by different methods, and thus, a manufacturing process of the third semiconductor chip 300 may be simplified and yield may be improved. This will be described in more detail below together with the components of the third semiconductor chip 300.

The second and third semiconductor chips 200 and 300 may be directly bonded and coupled to a lower surface (e.g., active surface) of the first semiconductor chip 100 without connection members such as metal bumps, or the like. This structure may be referred to as hybrid bonding, dielectric bonding, or the like, and may consist of metal bonding by pads bonded to each other and dielectric bonding by insulating layers bonded to each other.

Hereinafter, each component of the semiconductor device 10A according to various example embodiments will be described.

The first semiconductor chip 100 may include a first substrate 110, a first circuit layer 120, first pads 131 and 132, and a first insulating layer 133. The first semiconductor chip 100 may have a flat lower surface provided by the first pads 131 and 132 and the first insulating layer 133.

The first substrate 110 may be a semiconductor wafer including a semiconductor element such as silicon or germanium, or a compound semiconductor such as silicon carbide (SiC), gallium arsenide (GaAs), indium arsenide (InAs), and indium phosphide (InP), but example embodiments are not limited thereto. The first substrate 110 may have an active surface (e.g., a surface facing a first circuit layer 120) having an active region doped with impurities and an inactive surface opposite to that of the first substrate 110.

The first circuit layer 120 may be disposed on a lower surface of the first substrate 110, and may include an interlayer insulating layer 121 and an interconnection structure 125. The interlayer insulating layer 121 may include Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or a combination thereof, but example embodiments are not limited thereto. At least a portion of the interlayer insulating layer 121 surrounding the interconnection structure 125 may be formed of a low-k dielectric layer. The interlayer insulating layer 121 may be formed using a chemical vapor deposition (CVD), a flowable-CVD process, or a spin coating process, but example embodiments are not limited thereto.

The interconnection structure 125 may be formed in a multi-layer structure including an interconnection pattern and a via including, for example, aluminum (Al), gold (Au), cobalt (Co), copper (Cu), nickel (Ni), lead (Pb), tantalum (Ta), or tellurium (Te), titanium (Ti), tungsten (W), or a combination thereof, but example embodiments are not limited thereto. A barrier film (not shown) including titanium (Ti), titanium nitride (TiN), tantalum (Ta), tantalum nitride (TaN), etc. may be disposed between the interconnection pattern and/or via and the interlayer insulating layer 121. Individual devices 115 constituting an integrated circuit may be disposed on a lower surface (or an active surface) of the first substrate 110. The interconnection structure 125 may be electrically connected to the individual elements 115 by an interconnection portion 113 (e.g., a contact plug). The individual devices 115 may include FETs such as planar FETs or FinFETs, memory devices such as flash memory, DRAM, SRAM, EEPROM, PRAM, MRAM, FeRAM, RRAM, or the like, logic devices such as AND, OR, NOT, or the like, and various active and/or passive devices such as system LSI, CIS, and MEMS, but example embodiments are not limited thereto.

The first pads 131 and 132 may include first pads 131 of a first group and first pads 132 of a second group disposed on a lower surface of the first semiconductor chip 100. The first pads 131 of a first group may be connection terminals electrically connected to the interconnection structure 125 of the first circuit layer 120. The first pads 132 of a second group may be dummy pads insulated from the interconnection structure 125. The first pads 131 of a first group and the first pads 132 of a second group may include any one of copper (Cu), nickel (Ni), titanium (Ti), aluminum (Al), gold (Au), and silver (Ag), or an alloy thereof, but example embodiments are not limited thereto. The first group of first pads 131 may be disposed to overlap the second semiconductor chip 200 in a direction (e.g., Z-axis direction), perpendicular or substantially perpendicular to the lower surface of the first semiconductor chip 100. The first pads 132 of the second group may be disposed to overlap the third semiconductor chip 300 in a vertical direction (e.g., Z-axis direction). The first pads 131 and 132 may form bonding surfaces between the first semiconductor chip 100 and the second and third semiconductor chips 200 and 300 together with the first insulating layer 133. Accordingly, upper surfaces and side surfaces of the first pads 131 and 132 may be covered by the first insulating layer 133, and first barrier layers 131B and 132B may be disposed between the first insulating layer 133 and the first pads 131 and 132, respectively. The first barrier layers 131B and 132B may include at least one of titanium (Ti), titanium nitride (TiN), tantalum (Ta), and tantalum nitride (TaN), but example embodiments are not limited thereto.

The first insulating layer 133 may be disposed below the first circuit layer 120 and may be formed to surround the first pads 131 and 132. The first insulating layer 133 may include a material that can be bonded to each other by bonding to a second insulating layer 233 of the second semiconductor chip 200 and a third insulating layer 333 of the third semiconductor chip 300, for example, silicon oxide (SiO), silicon carbonitride (SiCN), etc. That is, at least a portion of the first insulating layer 133 may be bonded to the second insulating layer 233 and the third insulating layer 333, to form a bonding surface between the first semiconductor chip 100 and the second and third semiconductor chips 200 and 300. According to an example embodiment, the first insulating layer 133 may include a first base insulating layer 133a disposed below the first circuit layer 120 and a first bonding insulating layer 133b disposed below the first base insulating layer 133a. The first base insulating layer 133a and the first bonding insulating layer 133b may include different insulating materials. For example, the first base insulating layer 133a may include silicon oxide (SiO), and the first bonding insulating layer 133b may include silicon carbonitride (SiC), but example embodiments are not limited thereto.

The second semiconductor chip 200 may be disposed below the first semiconductor chip 100, and may include a second substrate 210, a second circuit layer 220, second upper pads 231, and a second insulating layer 233, through electrodes 240, and second lower pads 251. The second semiconductor chip 200 may be provided by the second upper pads 231 and the second insulating layer 233, and may have a flat upper surface in contact with a lower surface of the first semiconductor chip 100. Hereinafter, the second upper pads 231 and the second lower pads 251 may be collectively referred to as "second pads". According to an example embodiment, the number of the second semiconductor chips 200 may be less than or greater than that shown in the drawings. For example, the second semiconductor chip 200 may be provided as two or more semiconductor chips horizontally disposed under the first semiconductor chip 100. Also, according to an example embodiment, the second semiconductor chip 200 may be provided as a plurality of semiconductor chips stacked under the first semiconductor chip 100 in a vertical direction (e.g., Z-axis direction). For example, the second semiconductor chip 200 may have a thickness in a range of about 5 μm to about 20 μm, but example embodiments are not limited thereto.

Since the second semiconductor chip 200 may have a structure substantially the same as or similar to that of the first semiconductor chip 100, the same or similar components are denoted by the same or similar reference numerals, and the following repetition of the same components description is omitted. For example, since the second substrate 210 and the second circuit layer 220 may have the same or similar characteristics to the above-described first substrate 110 and the first circuit layer 120, components corresponding to each other are indicated by similar reference numbers, and overlapping descriptions are omitted. A second interlayer insulating layer 221, a second interconnection structure 225, and second individual elements 215 may have the same or similar characteristics to the above-described a first interlayer insulating layer 121, a first interconnection structure 125, and first individual elements 115.

The second pads 231 and 251 may include second upper pads 231 in contact with the first pads 131 of the first group, and second lower pads 251 opposite to the second upper pads 231. The second upper pads 231 may form a bonding surface between the first semiconductor chip 100 and the second semiconductor chip 200 together with the second insulating layer 233. Accordingly, lower surfaces and side surfaces of the second upper pads 231 may be covered by the second insulating layer 233, and a second upper barrier layer 231B may be disposed between the second insulating layer 233 and the second upper pads 231. The second lower pads 251 may be formed to more protrude than the lower insulating layer 216 (e.g., 'insulating protective layer') disposed below the second substrate 210. Accordingly, a second lower barrier layer 251B may be disposed between upper surfaces of the second lower pads 251 and the lower insulating layer 216, and side surfaces of the second lower pads 251 may be exposed from the second lower barrier layer 251B. That is, the second lower pads 251 not forming a hybrid bonding surface may be formed by a simplified manufacturing method compared to the second upper pads 231, thereby improving yield and reducing manufacturing costs. The second pads 231 and 251 and the second barrier layers 231B and 251B may include the same or similar material to the first pads 132 and the first barrier layers 131B and 132B, respectively.

The second insulating layer 233 may be disposed on the second circuit layer 220 to surround the second upper pads 231. The second insulating layer 233 may include a material capable of being bonded to and coupled to the first insulating layer 133, for example, silicon oxide (SiO), silicon carbonitride (SiCN), etc. According to an example embodiment, the second insulating layer 233 may include a second base insulating layer 233a and a second bonding insulating layer 233b.

The through electrodes 240 may pass through the second substrate 210 to electrically connect at least a portion of the second upper pads 231 and the second lower pads 251 to each other. The through electrodes 240 may be electrically connected to the first pads 131 of the first group through the second upper pads 231. The through electrodes 240 may include a via plug 245 and a side barrier film 241 surrounding a side surface of the via plug 245. The via plug 245 may include, for example, tungsten (W), titanium (Ti), aluminum (Al), copper (Cu), etc., and may be formed by a plating process, a PVD process, a CVD process, etc. The side barrier film 241 may include titanium (Ti), titanium nitride (TiN), tantalum (Ta), tantalum nitride (TaN), etc., and may be formed by a plating process, a PVD process, a CVD process, etc. A side insulating film (not shown) including an insulating material (e.g., a High Aspect Ratio Process (HARP) oxide) such as silicon oxide, silicon nitride, silicon oxynitride, etc., may be formed between the side barrier film 241 and the second substrate 210.

An insulating protective layer 216 and a buffer film 217 may be disposed below the through electrodes 240. The insulating protective layer 216 may electrically insulate the second lower pad 251 from the second substrate 210, for example, the insulating protective layer 216 may include silicon oxide (SiO), silicon nitride (SiN), silicon carbide (SiC), silicon oxynitride (SiON), or silicon carbonitride (SiCN), but example embodiments are not limited thereto. The buffer film 217 may be a polishing stop layer, a barrier layer, etc., spaced apart from the through electrodes 240 and disposed below the insulating protective layer 216. For example, the buffer film 217 may include silicon nitride, silicon carbide, silicon oxynitride, or silicon carbonitride, but example embodiments are not limited thereto.

The third semiconductor chip 300 may be spaced apart from the second semiconductor chip 200 and disposed below the first semiconductor chip 100, and may include a third substrate 310, third upper pads 331, a third insulating layer 333, dummy electrode structures 340, and third lower pads 351. Hereinafter, the third upper pads 331 and the third lower pads 351 may be collectively referred to as "third pads". According to an example embodiment, the third semiconductor chip 300 may be provided in a number less than or greater than that shown in the drawings. For example, the third semiconductor chip 300 may be provided as a plurality of dummy chips stacked under the first semiconductor chip 100 in a vertical direction (e.g., Z-axis direction). The third semiconductor chip 300 may be provided by the third upper pads 331 and the third insulating layer 333, and may have a flat upper surface in contact with a lower surface of the first semiconductor chip 100.

The third pads 331 and 351 may include third upper pads 331 in contact with the first pads 132 of a second group, and third lower pads 351 opposite to the third upper pads 331.

The third upper pads 331 may have lower surfaces and side surfaces covered by the third insulating layer 333. A third upper barrier layer 331B extending along the lower surfaces and side surfaces of the third upper pads 331 may be disposed between the third insulating layer 333 and the third upper pads 331. Upper surfaces of the third upper pads 331 may provide a bonding surface between the first semiconductor chip 100 and the third semiconductor chip 300 together with the third insulating layer 333. The third upper pads 331 and the third insulating layer 333 may be formed to have a desired (or, alternatively predetermined) planar area ratio in order to facilitate quality of the bonding surface between the first semiconductor chip 100 and the third semiconductor chip 300. For example, a sum of the planar or substantially planar areas of each of the third upper pads 331 may be in a range from about 5% to about 25%, from about 5% to about 15%, etc., of a planar area of the upper surface of the third semiconductor chip 300, but example embodiments are not limited thereto. When the sum of the planar areas of the third upper pads 331 is less than about 5%, an effect of improving heat dissipation by the third semiconductor chip 300 may be lesser or insignificant. When the sum of the planar areas of the third upper pads 331 exceeds about 25%, the quality of the bonding interface may be deteriorated. Meanwhile, the third upper pads 331 may be spaced apart from an edge of the third semiconductor chip 300 by a distance d of about 100 μm, or more or less, in consideration of a dicing process.

The third lower pads 351 may surround lower portions of the dummy electrode structures 340 and may be disposed below the lower insulating layer 311 providing a lower surface of the third semiconductor chip 300. That is, the third lower pads 351 protrude from the lower surface of the third semiconductor chip 300, and the lower surfaces of the third lower pads 351 may be disposed on a lower level than the lower surface of the third semiconductor chip 300. Here, the lower insulating layer 311 may refer to an insulating material layer disposed below the third substrate 310, and in order to distinguish it from the lower insulating layer 311, the "third insulating layer 333" may be referred to as "a third upper insulating layer 333". A third lower barrier layer 351B extending along upper surfaces of the third lower pads 351 may be disposed between the upper surfaces of the third lower pads 351 and the lower insulating layer 311, and side surfaces of the third lower pads 351 may be exposed from the third lower barrier layer 351B.

That is, the third lower pads 351 not forming a hybrid bonding surface may be formed by a simplified manufacturing method compared to the third upper pads 331, thereby improving yield and reducing manufacturing costs. Each of the third pads 331 and 351 and the third barrier layers 331B and 351B may include the same or similar material to the first pads 132 and the first barrier layers 131B and 132B.

The third insulating layer 333 may include a material that may be bonded and coupled to the first insulating layer 133 while surrounding third upper pads 331, for example, silicon oxide (SiO), silicon carbonitride (SiCN), etc. According to an example embodiment, the third insulating layer 333 may include a third base insulating layer 333a and a third bonding insulating layer 333b.

For example, an insulating protective layer 312 and a buffer film 314 may be disposed below the third insulating layer 333. The insulating protective layer 312 may electrically insulate the third upper pad 331 from the third substrate 310 and may include, for example, silicon oxide (SiO), silicon nitride (SiN), silicon carbide (SiC), or silicon oxynitride (SiON) or silicon carbonitride (SiCN), but example embodiments are not limited thereto. The buffer film 314 may be a polishing stop layer, a barrier layer, etc., spaced apart from the dummy electrode structures 340 and disposed above the insulating protective layer 312. For example, the buffer film 314 may include silicon nitride, silicon carbide, silicon oxynitride, silicon carbonitride, etc. In the drawing, the insulating protective layer 312 and the buffer film 314 may be disposed in an upper portion of a third substrate 310, but the inventive concepts are not limited thereto and may be disposed in a lower portion of the third substrate 310. That is, according to an example embodiment, the third substrate 310 may have a shape in which the upper and lower portions shown in FIG. 1C are inverted. Even in this case, it can be understood that the third upper pads 331 and the third lower pads 351 may have the shapes shown in the drawings.

The dummy electrode structures 340 may penetrate through the third substrate 310 to connect the third upper pads 331 and the third lower pads 351 to each other. The dummy electrode structures 340 may be electrically connected to the first pads 132 of a second group through the third upper pads 331. The dummy electrode structures 340 may include a dummy via plug 345 and a dummy side barrier film 341. The dummy via plug 345 and the dummy side barrier film 341 may have the same or similar (or different) characteristics to the above-described via plug 245 and the side barrier film 241.

Each of the dummy electrode structures 340 may have a width W1 greater than a width W2 of each of the through electrodes 240 of the second semiconductor chip 200. For example, the width W1 of the dummy electrode structures 340 may be in a range of about 1.5 to 3 times, about 1.5 to 2 times, etc., the width W2 of the through electrodes 240. For example, the width W2 of the through electrodes 240 may be in a range of about 1 μm to about 10 μm, of about 2 μm to about 8 μm, or of about 3 μm to about 7 μm, but example embodiments are not limited thereto. When the width W1 of the dummy electrode structures 340 is less than about 1.5 times the width W2 of the through electrodes 240, the heat dissipation improvement effect may be lesser or insignificant. In this regard, the third upper pads 331 connected to the dummy electrode structures 340 may have a width greater than the width of the second upper pads 231 connected to the through electrodes 240, and the first pads 132 of a second group connected to the third upper pads 331 may have a width greater than the width of the first pads 131 of a first group connected to the second upper pads 231.

The encapsulant 410 may be disposed below the first semiconductor chip 100, and may encapsulate at least a portion of each of the second and third semiconductor chips 200 and 300. The encapsulant 410 may contact a side surface of each of the second lower pads 251 and the third lower pads 351, and may be coplanar or substantially coplanar with respective lower surfaces of the second lower pads 251 and the third lower pads 351. The encapsulant 410 may include a dielectric material such as silicon oxide, silicon nitride, or silicon oxynitride, or a polymer material such as an epoxy resin or polyimide, but example embodiments are not limited thereto.

The redistribution structure 510 may be disposed below the encapsulant 410, the second semiconductor chip 200, and the third semiconductor chip 300, and may include an insulating material layer 511 and a conductive structure 512. The insulating material layer 511 may include a dielectric material such as silicon oxide, silicon nitride, silicon oxynitride, etc., or a photosensitive resin such as a photo-imageable dielectric (PID). The conductive structure 512 may be electrically connected to the second semiconductor chip 200 and the third semiconductor chip 300, and may include for example, copper (Cu), aluminum (Al), silver (Ag), tin (Sn), gold (Au), nickel (Ni), lead (Pb), titanium (Ti), or a metal material including an alloy thereof, but example embodiments are not limited thereto. The conductive structure 512 may include, for example, a ground pattern, a power pattern, and a signal pattern. The signal pattern may refer to a conductive pattern and a via transmitting a data signal transmitted from the first semiconductor chip 100 and the second semiconductor chip 200 externally, transmitting the data signal transmitted from the outside to the first semiconductor chip 100 and the second semiconductor chip 200, etc. According to an example embodiment, at least a portion of the ground pattern may be connected to the third semiconductor chip 300.

The bump structures 520 may be electrically connected to the second lower pads 251 and the third lower pads 351 below the second semiconductor chip 200 and the third semiconductor chip 300. For example, the bump structures 520 may be disposed below the redistribution structure 510, and may be electrically connected to the through electrodes 240 and the dummy electrode structures 340 through the conductive structure 512. The bump structures 520 may be conductive structures including, for example, solder balls and/or metal posts.

Figure 2A:
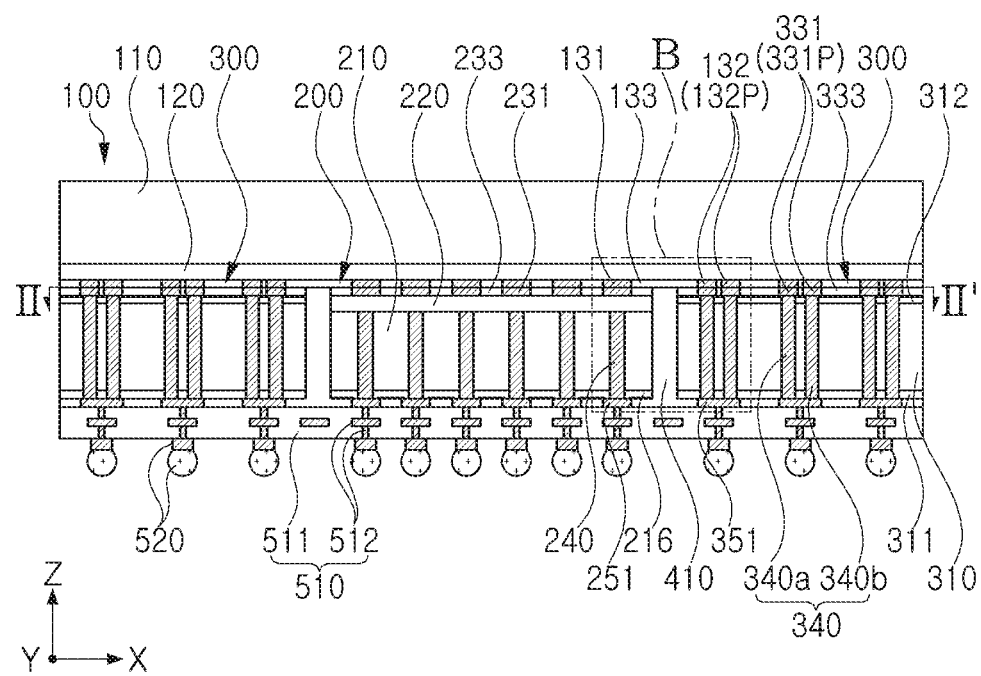
FIG. 2A is a cross-sectional view illustrating a semiconductor device according to an example embodiment of the inventive concepts.
Figure 2B:
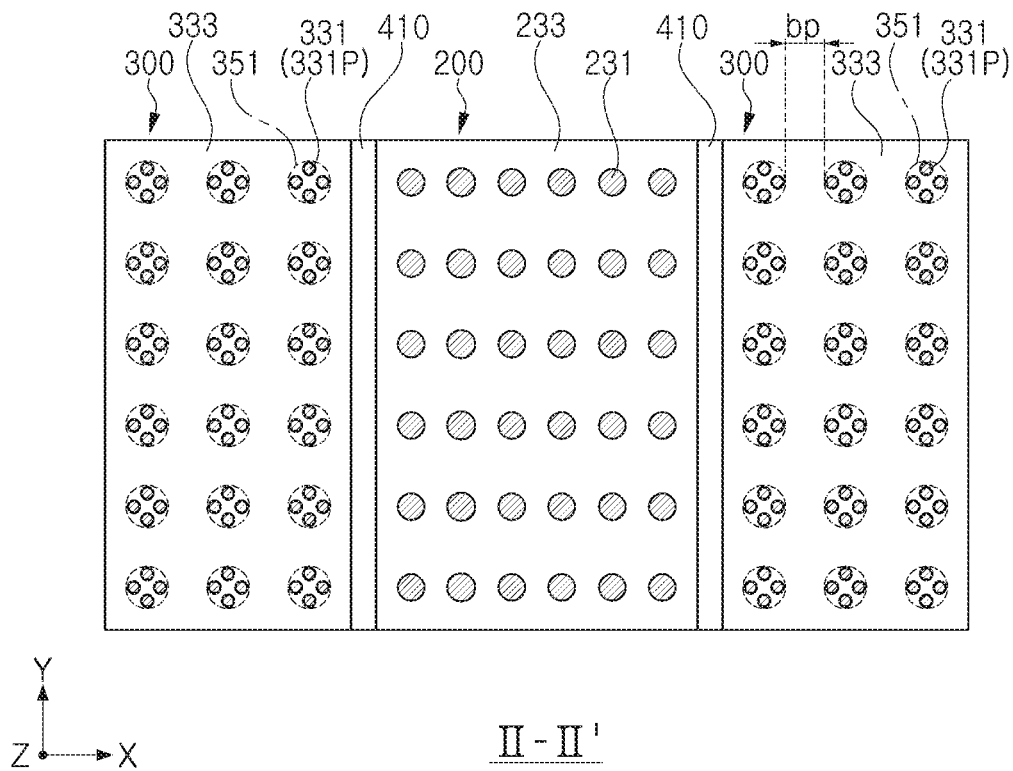
FIG. 2B is a plan view illustrating a cross-section taken along line II-II' of FIG. 2A.
Figure 2C:
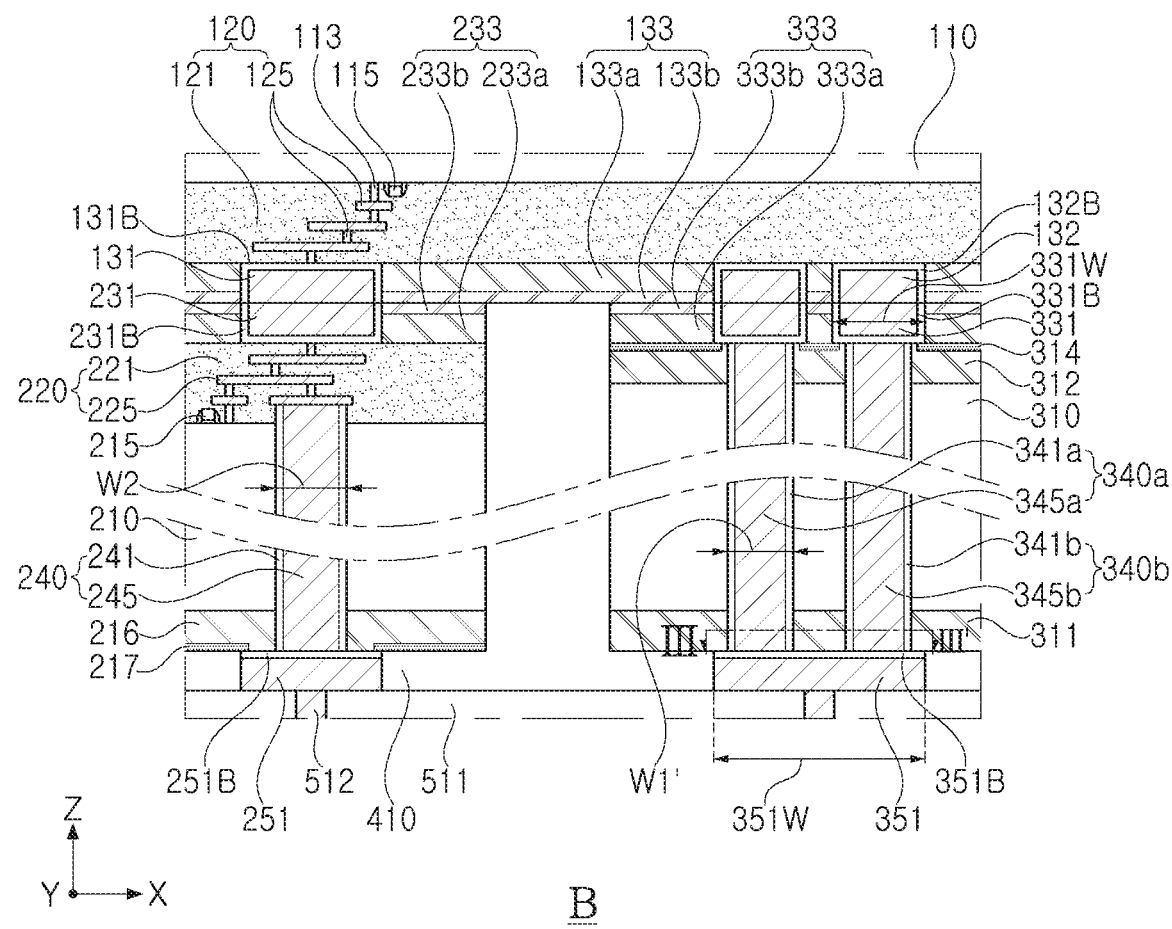
FIG. 2C is a partial enlarged view illustrating region 'B' of FIG. 2A.
Figure 2D:
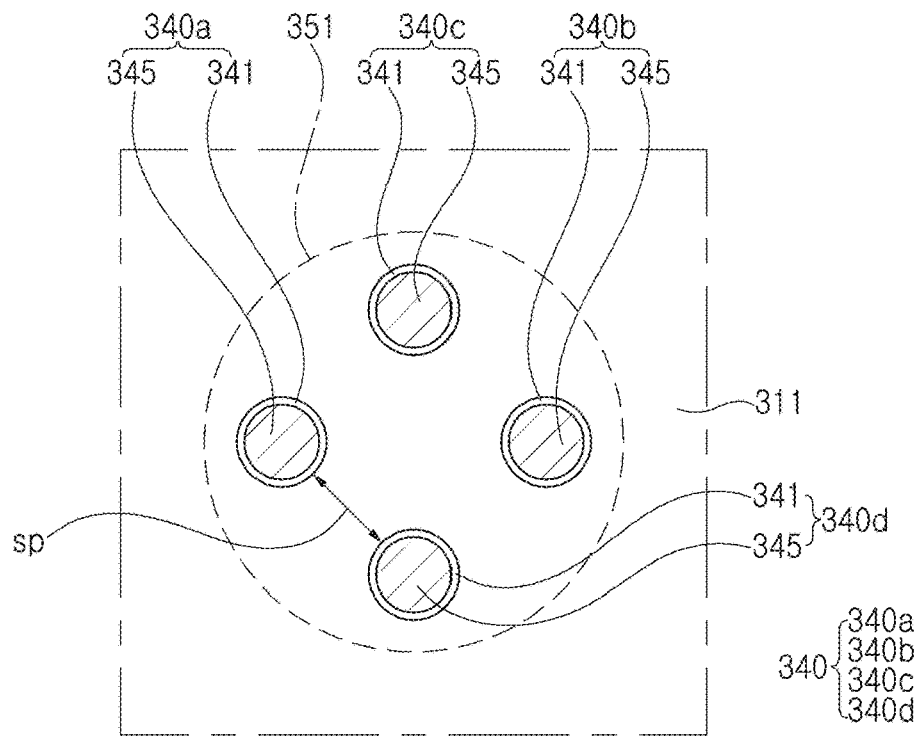
FIG. 2D is a plan view illustrating a cross-section taken along line III-III' of FIG. 2C.

FIG. 2A is a cross-sectional view illustrating a semiconductor device 10B according to an example embodiment of the inventive concepts, FIG. 2B is a plan view illustrating a cross-section taken along line II-II' of FIG. 2A, FIG. 2C is a partial enlarged view showing region 'B' of FIG. 2A, and FIG. 2D is a plan view illustrating a cross-section taken along line III-III' of FIG. 2C.

Referring to FIGS. 2A to 2D, the semiconductor device 10B according to an example embodiment may have the same or similar characteristics as those described with reference to FIGS. 1A to 1C except that, e.g., the semiconductor device 10B may include dummy electrode structures 340 including a plurality of dummy electrodes 340a, 340b, 340c, and 340d connected to one of the third lower pads 351.

The third semiconductor chip 300 of the present example embodiment may include a dummy electrode structure 340 including a plurality of dummy electrodes 340a, 340b, 340c, and 340d, a third lower pad 351 disposed between bump structures 520 and the dummy electrode structure 340 and connected to the plurality of dummy electrodes 340a, 340b, 340c, and 340d, and a plurality of third upper pads 331P respectively connected to the plurality of dummy electrodes 340a, 340b, 340c, and 340d. In addition, the first semiconductor chip 100 may include first pads 132P of a second group in contact with the plurality of third upper pads 331P, respectively. In this case, the third lower pads 351 may have a width 351W greater than a width 331W of the third upper pads 331, and the plurality of upper pads 331P and the first pads 132P of a second group connected to the plurality of dummy electrodes 340a, 340b, 340c, and 340d may overlap one third lower pad 251 in a vertical direction (e.g., Z-axis direction). According to some example embodiments, a ratio of the first pads 132 of a second group and the third upper pads 331 may be reduced on a lower surface of the first semiconductor chip 100 and an upper surface of the third semiconductor chip 300, respectively, and a ratio of the first insulating layer 133 and the third insulating layer 333 can be appropriately increased, and as a result, a quality of a bonding interface between the first semiconductor chip 100 and the third semiconductor chip 300 may be improved.

The plurality of dummy electrodes 340a, 340b, 340c, and 340d may be clustered within a planar or substantially planar area of one third lower pad 251 to improve heat dissipation characteristics of the semiconductor device 10B. In this case, the plurality of dummy electrodes 340a, 340b, 340c, and 340d may have a width W1' in a range of about 0.5 times to about 1.5 times a width W2 of each of the through electrodes 240 of the second semiconductor chip 200, or greater. This means that the plurality of dummy electrodes 340a, 340b, 340c, and 340d may have a smaller width W1' than that of the through electrodes 240, and are not limited to the above-described numerical range. That is, according to an actual width W2 of the through electrodes 240, the width W1' of the plurality of dummy electrodes 340a, 340b, 340c, and 340d may be 0.5 times or less or about 1.5 times or more of the width W2 of the through electrodes 240. Meanwhile, the plurality of dummy electrodes 340a, 340b, 340c, and 340d may be provided with more or fewer dummy electrodes than illustrated in the drawings. For example, the dummy electrode structure 340 may include two, three, or five or more dummy electrodes.

A separation distance sp between the plurality of dummy electrodes 340a, 340b, 340c, and 340d may be in a range of about 2 μm or more, for example, about 2 μm to about 8 μm, about 2 μm to about 7 μm, or about 2 μm to about 6 μm, but example embodiments are not limited thereto. When the separation distance sp of the plurality of dummy electrodes 340a, 340b, 340c, and 340d is less than about 2 μm, the process difficulty may increase and the spacing between the plurality of third upper pads 331P may become too narrow.

A spacing bp between the third lower pads 351 may be in a range of about 25 μm or less, for example, in a range of about 5 μm to about 25 μm, about 10 μm to about 25 μm, or about 15 μm to about 25 μm, but example embodiments are note limited thereto. When a spacing dp between the third lower pads 351 exceeds about 25 μm (or more or less), a heat dissipation effect by the dummy electrode structures 340 may be deteriorated.

Figure 3:
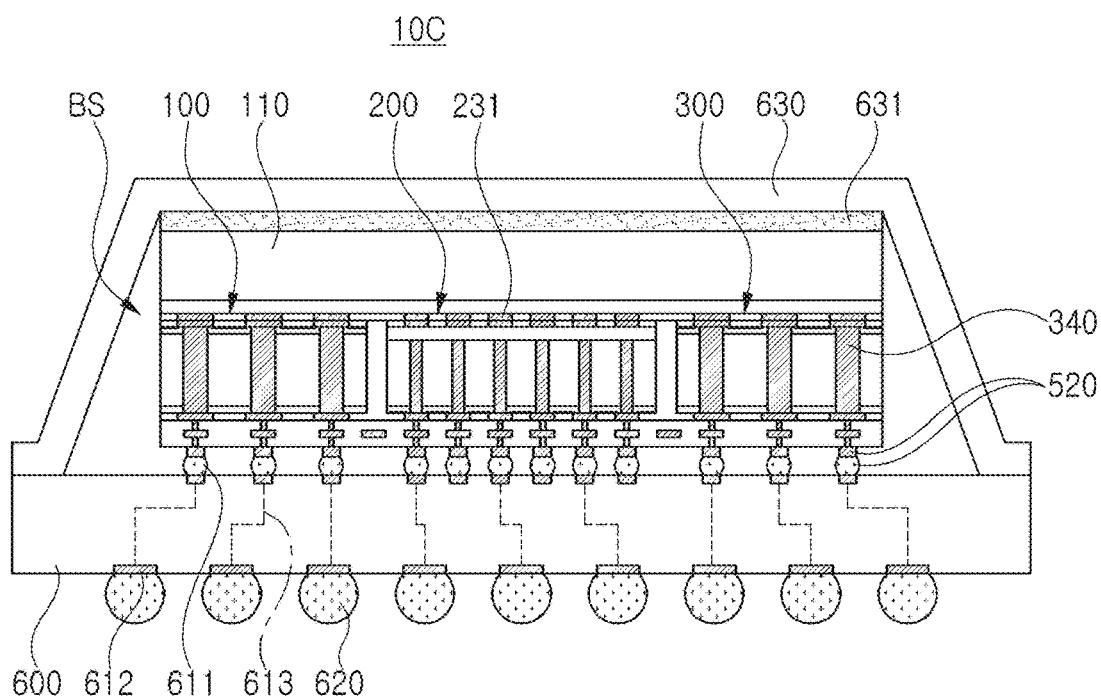
FIG. 3 is a cross-sectional view illustrating a semiconductor device according to an example embodiment of the inventive concepts.

FIG. 3 is a cross-sectional view illustrating a semiconductor device 10c according to an example embodiment of the inventive concepts.

Referring to FIG. 3, the semiconductor device 10C according to an example embodiment may have the same or similar characteristics as those described with reference to FIGS. 1A to 2D, except that, e.g., the semiconductor device 10c may further include an interconnection board 600 and a heat dissipation structure 630.

The interconnection board 600 may be a support substrate on which a bonding structure BS including a first semiconductor chip 100, a second semiconductor chip 200, a third semiconductor chip 300, a bump structure 520, and the like is mounted, and may be a substrate for a semiconductor package, such as a printed circuit board (PCB), a ceramic substrate, a tape interconnection board, etc. The interconnection board 600 may include a lower pad 612 disposed on a lower surface of a body, an upper pad 611 disposed on an upper surface of the body, and an interconnection circuit 613 electrically connecting the lower pad 612 and the upper pad 611. The body of the interconnection board 600 may include different materials depending on the type of the substrate. For example, when the interconnection board 600 is a printed circuit board, it may have a form in which an interconnection layer is additionally laminated on one side or both sides of a body copper clad laminate a copper clad laminate, etc. The lower and upper pads 612 and 611 and the interconnection circuit 613 may form an electrical path connecting a lower surface and an upper surface of the interconnection board 600. External connection bumps 620 connected to the lower pad 612 may be disposed on the lower surface of the interconnection board 600. The external connection bump 620 may include tin (Sn), indium (In), bismuth (Bi), antimony (Sb), copper (Cu), silver (Ag), zinc (Zn), lead (Pb), and/or alloys thereof, but example embodiments are not limited thereto.

The heat dissipation structure 630 may be disposed on an upper surface of the interconnection board 600 and may be formed to cover an upper portion of the first semiconductor chip 100. The heat dissipation structure 630 may be attached on the interconnection substrate 600 by an adhesive. As the adhesive, a thermal conductive adhesive tape, a thermal conductive grease, a thermal conductive adhesive, or the like may be used. The heat dissipation structure 630 may be in close contact with the first semiconductor chip 100 by an adhesive member 631 on an upper surface of the first semiconductor chip 100. The heat dissipation structure 630 may include a conductive material having excellent thermal conductivity. For example, the heat dissipation structure 630 may include a metal or a metal alloy including gold (Au), silver (Ag), copper (Cu), iron (Fe), or the like, or graphite, graphene, etc., but example embodiments are not limited thereto. The heat dissipation structure 630 may have a shape different from that shown in the drawings. For example, the heat dissipation structure 630 may have a shape covering only the upper surface of the first semiconductor chip 100.

Figure 4A:
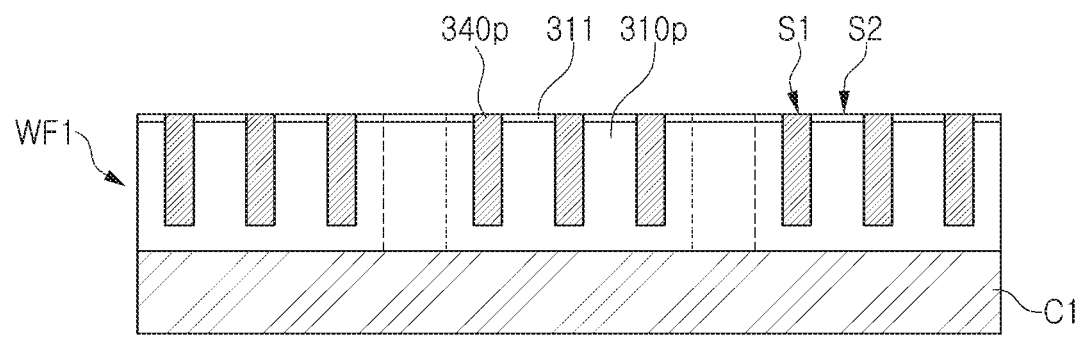
FIGS. 4A and 4B are cross-sectional views illustrating an example manufacturing process of third lower pads of a third semiconductor chip applied to the inventive concepts.
Figure 4B:
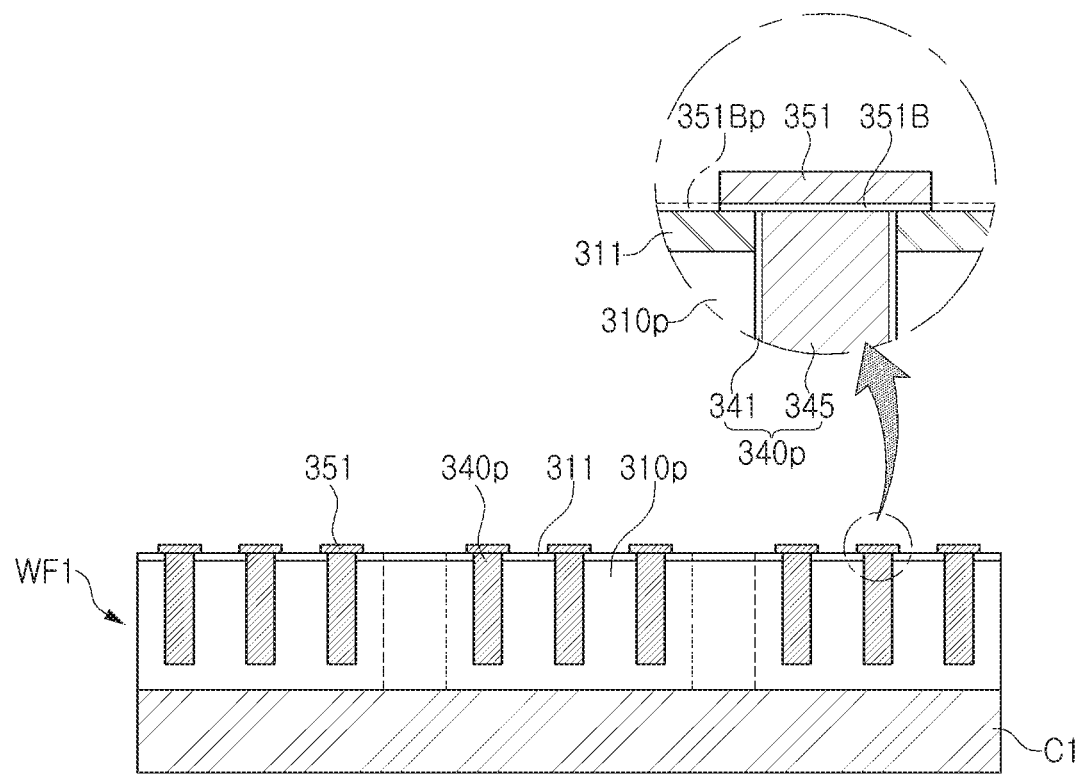

FIGS. 4A to 4B are cross-sectional views illustrating an example manufacturing process of third lower pads 351 of a third semiconductor chip 300 applied to the inventive concepts.

Referring to FIG. 4A, a semiconductor wafer WF1 for a plurality of third semiconductor chips 300 may be prepared. The semiconductor wafer WF1 may be temporarily supported on a first carrier substrate C1. The semiconductor wafer WF1 may include components for the third semiconductor chips 300, for example, a preliminary substrate 310p before a thickness thereof is adjusted by a backgrinding process, and a lower insulating layer 311 formed on the preliminary substrate 310p. In addition, preliminary dummy electrode structures 340p extending into the preliminary substrate 310p through the lower insulating layer 311 may be included. The preliminary dummy electrode structures 340p may be formed so as not to completely penetrate through the preliminary substrate 310p. An upper surface S1 of the preliminary dummy electrode structures 340p may be coplanar or substantially coplanar with an upper surface S2 of the lower insulating layer 311 by a planarization process.

Referring to FIG. 4B, third lower pads 351 may be respectively formed on preliminary dummy electrode structures 340p. The third lower pads 351 may be formed using, for example, a semi-additive process (SAP) method. For example, a preliminary barrier layer 351Bp and a photosensitive material layer (e.g., photoresist) (not shown) may be formed on upper surfaces of the preliminary dummy electrode structures 340p and an upper surface of the lower insulating layer 311, and a photolithography process, an ashing process, an etching process, or the like, may be performed to form third lower barrier layers 351B and third lower pads 351. The third lower barrier layers 351B and the third lower pads 351 may be formed using a plating process, a PVD process, a CVD process, etc. For example, the third lower barrier layers 351B may include titanium (Ti) or titanium nitride (TiN), and the third lower pads 351 may include copper (Cu), but example embodiments are not limited thereto. A seed layer (not shown) including the same material as that of the third lower pads 351 may be formed between the third lower barrier layers 351B and the third lower pads 351. Accordingly, the third lower pads 351 may protrude onto the third lower insulating layer 311, and side surfaces of the third lower pads 351 may be exposed from the third lower barrier layers 351B.

Figure 5A:
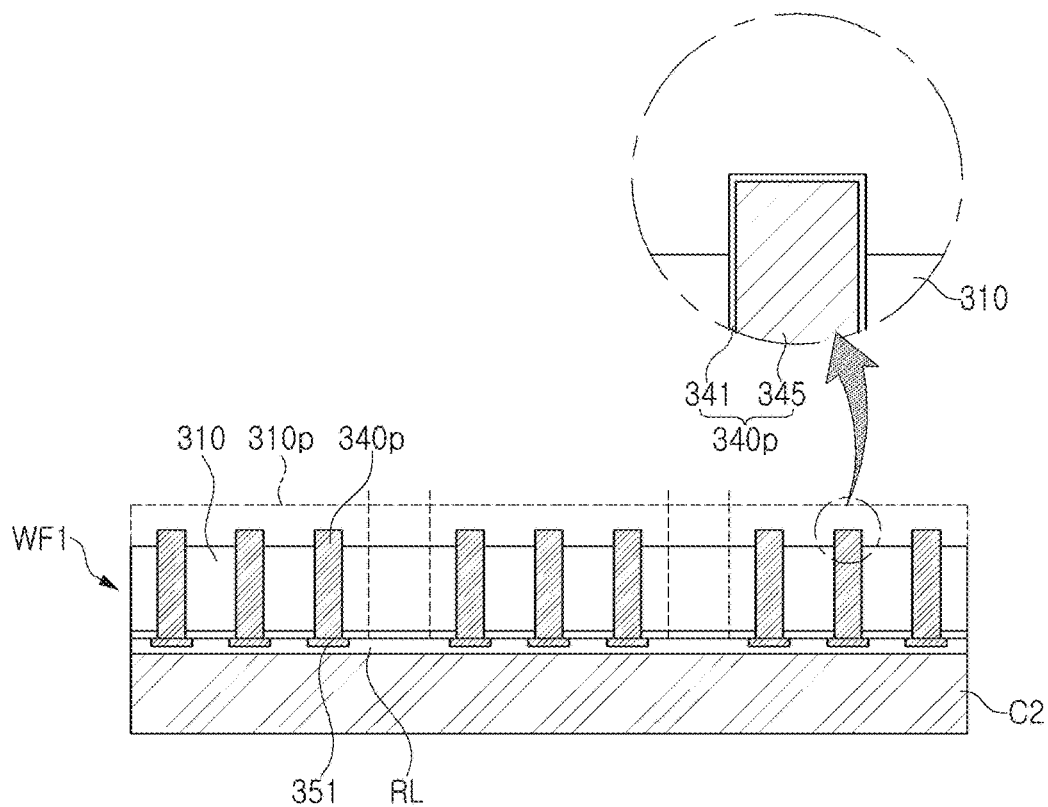
FIGS. 5A, 5B and 5C are cross-sectional views exemplarily illustrating an example manufacturing process of third upper pads of a third semiconductor chip applied to the inventive concepts.
Figure 5B:
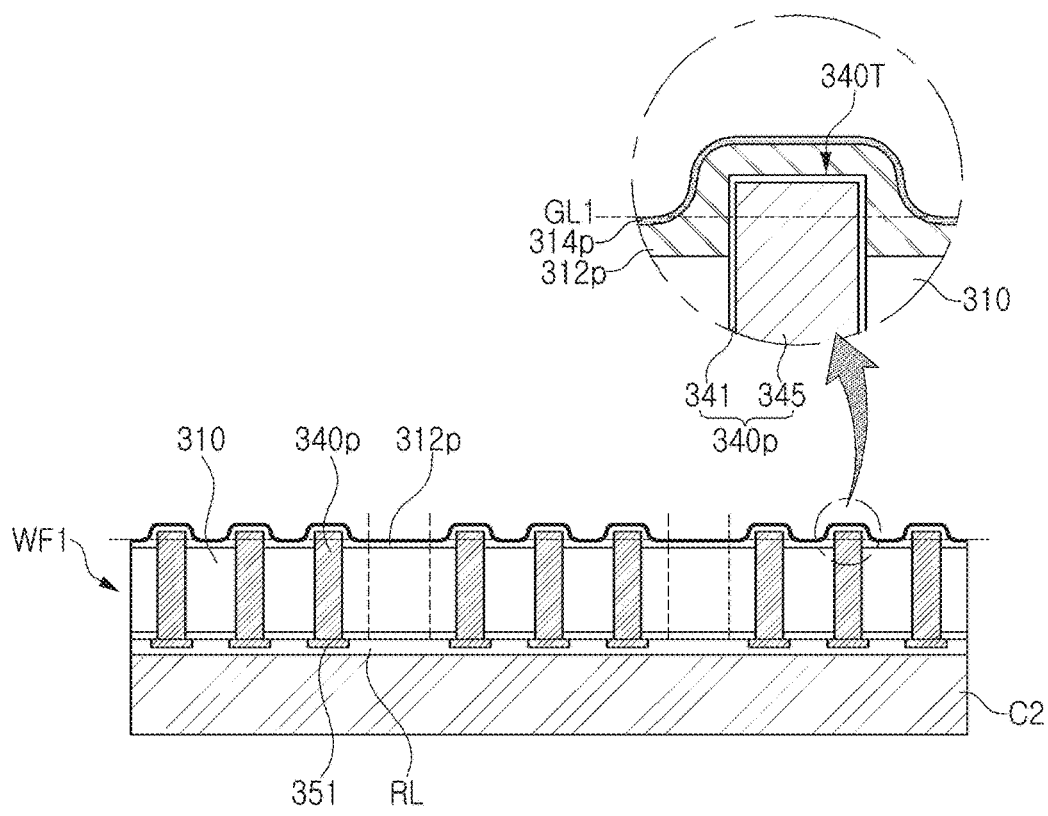
Figure 5C:
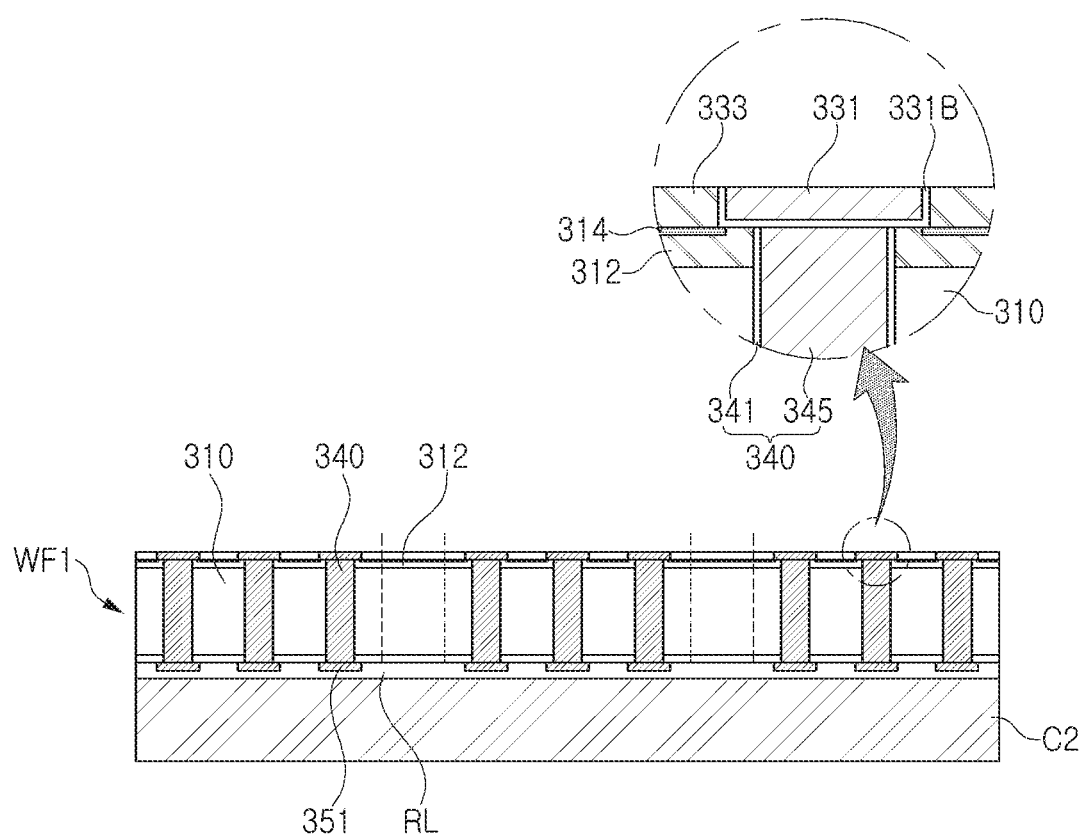

FIGS. 5A to 5C are cross-sectional views illustrating an example manufacturing process of a third upper pads 331 of a third semiconductor chip 300 applied to the inventive concepts.

Referring to FIG. 5A, first, a portion of a preliminary substrate 310p of a semiconductor wafer WF1 may be removed to form a substrate 310 (e.g., a "third substrate") from which preliminary dummy electrode structures 340p protrude. The semiconductor wafer WF1 may include preliminary dummy electrode structures 340p and third lower pads 351 formed through the processes of FIGS. 4A and 4B. The semiconductor wafer WF1 may be temporarily attached to a second carrier substrate C2 by a bonding material layer RL. A substrate 310 having a desired thickness may be formed by applying a polishing process to the preliminary substrate 310p. The polishing process may be performed by a grinding process such as a chemical mechanical polishing (CMP) process, an etch-back process, a combination thereof, etc. For example, the preliminary substrate 310p may be reduced to a desired (or, alternatively predetermined) thickness by performing a grinding process, and the preliminary dummy electrode structures 340p may be sufficiently exposed by applying an etch-back condition under an appropriate condition.

Referring to FIG. 5B, a preliminary protective layer 312p and a preliminary buffer film 314p may be formed to cover upper ends 340T of preliminary dummy electrode structures 340p. The preliminary protective layer 312p may be formed of silicon oxide, and the preliminary buffer film 314p may be formed of silicon nitride or silicon oxynitride, but example embodiments are not limited thereto. The preliminary protective layer 312p and the preliminary buffer film 314p may be formed using a PVD process, a CVD process, etc. Subsequently, the preliminary protective layer 312p and the preliminary buffer film 314p may be planarized (e.g., ground). By a planarization process, the preliminary protective layer 312p, the preliminary buffer layer 314p, and the preliminary dummy electrode structures 340p may be removed up to a desired (or, alternatively predetermined) line GL1, and dummy electrode structures 340 exposed on an insulating protective layer 312 and a buffer film 314 may be formed.

Referring to FIG. 5C, a third insulating layer 333 and third upper pads 331 may be formed on the dummy electrode structures 340. The third upper pads 331 may be formed using, for example, a damascene method. That is, a third upper barrier layer 331B and the third upper pads 331 may be sequentially formed in an etched region of the first formed third insulating layer 333. The third insulating layer 333 may include, for example, silicon oxide (SiO) and/or silicon carbonitride (SiCN), and may be formed using a PVD or CVD process. The etching region of the third insulating layer 333 may be formed using, for example, an etching process such as reactive-ion etching (RIE) using a photoresist (not shown). The third upper barrier layer 331B and the third upper pads 331 may be formed using a plating process, a PVD process, a CVD process, etc. For example, the third upper barrier layer 331B may include titanium (Ti) or titanium nitride (TiN), and the third upper pads 331 may include copper (Cu), but example embodiments are not limited thereto. A seed layer (not shown) including the same material as that of the third upper pads 331 may be formed between the third upper barrier layer 331B and the third upper pads 331. Accordingly, the third upper barrier layer 331B may extend along lower surfaces and side surfaces of the third upper pads 331.

Figure 6A:
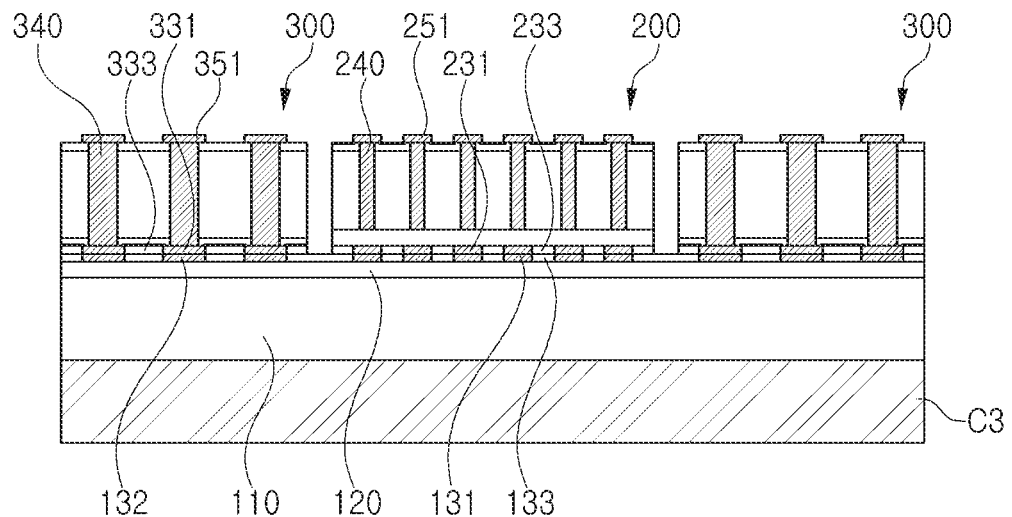
FIGS. 6A, 6B and 6C are cross-sectional views illustrating an example manufacturing process of the semiconductor device of FIG. 1A.
Figure 6B:
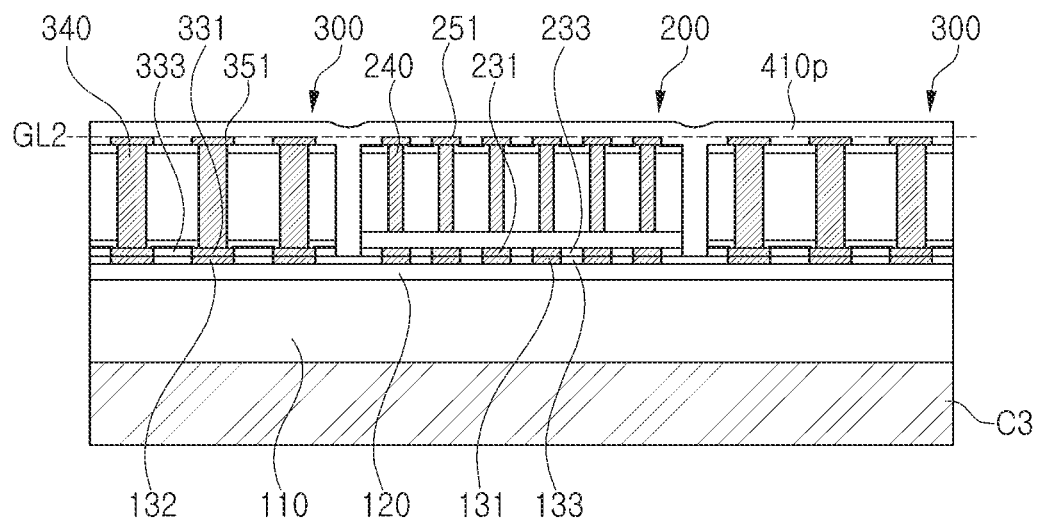
Figure 6C:
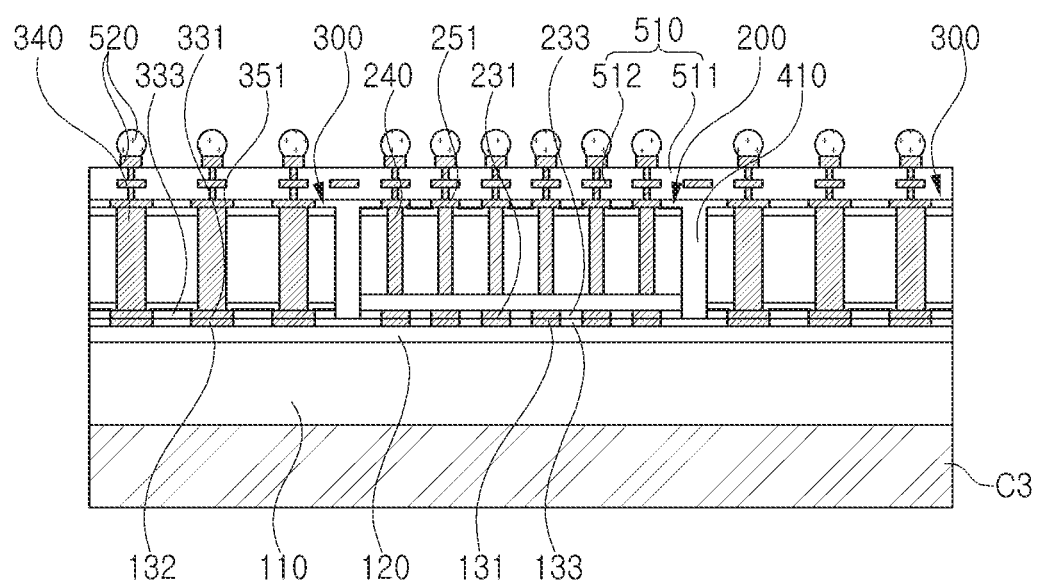

FIGS. 6A to 6C are cross-sectional views illustrating an example manufacturing process of the semiconductor device 10A of FIG. 1A.

Referring to FIG. 6A, first, a first semiconductor chip 100 may be prepared. The first semiconductor chip 100 may be provided as a semiconductor wafer including a plurality of first semiconductor chips 100. The first semiconductor chip 100 may be supported on a carrier substrate C3 such that a first circuit layer 120 faces upwardly. Thereafter, a second semiconductor chip 200 and the at least one third semiconductor chip 300 may be disposed on the first semiconductor chip 100, and a thermal compression process may be performed to combine the first to third semiconductors chips 100, 200, and 300. The thermal compression process may be performed in a thermal atmosphere in a range from about 100° C. to about 300° C. However, a temperature of the thermal atmosphere is not limited to the above-described range and may be variously changed.

Referring to FIG. 6B, a preliminary encapsulant 410p covering the second semiconductor chip 200 and the third semiconductor chip 300 may be formed on the first semiconductor chip 100. For example, the preliminary encapsulant 410p may include silicon oxide (SiO), and may be formed using a PVD or CVD process. Subsequently, the preliminary encapsulant 410p may be planarized (e.g., ground). By a planarization process, the preliminary encapsulant 410p may be removed up to a desired (or, alternatively predetermined) line GL2, and third lower pads 351 and second lower pads 251 may be exposed on the encapsulant 410.

Referring to FIG. 6C, a redistribution structure 510 and bump structures 520 may be sequentially formed on the second semiconductor chip 200 and the third semiconductor chip 300. The redistribution structure 510 may include a conductive structure 512 electrically connected to the third lower pads 351, the second lower pads 251, and the bump structures 520.

As set forth above, according to example embodiments of the inventive concepts, a semiconductor device having improved reliability may be provided by introducing a dummy chip including a dummy electrode structure.

Herein, a lower side, a lower portion, a lower surface, and the like, may be used to refer to a direction toward a mounting surface of the fan-out semiconductor package in relation to cross-sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second," the element is not limited thereby. Such terms may be used only for a purpose of distinguishing the element from other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Terms used herein are used only in order to describe an example embodiment rather than limiting the inventive concepts. In this case, singular forms include plural forms unless interpreted otherwise in context.

Various and advantageous advantages and effects of the inventive concepts are not limited to the above description, it will be more readily understood in the process of describing the specific embodiments of the inventive concepts.

While the example embodiments have been illustrated and described above, it may be apparent to those skilled in the art that modifications and variations could be made without departing from the scope of the inventive concepts.

What is claimed is:

1. A semiconductor device, comprising:
   a first semiconductor chip including first pads and a first insulating layer surrounding the first pads;
   a second semiconductor chip including second upper pads in contact with a first group of the first pads, a second insulating layer surrounding the second upper pads and in contact with the first insulating layer, second lower pads opposite to the second upper pads, and through electrodes connecting the second upper pads and the second lower pads to each other;
   a third semiconductor chip including third upper pads in contact with a second group of the first pads, an upper barrier layer extending along lower surfaces and side surfaces of the third upper pads, a third insulating layer surrounding the third upper pads and in contact with the first insulating layer, third lower pads opposite to the third upper pads, a lower barrier layer extending along upper surfaces of the third lower pads, and dummy electrode structures connecting the third upper pads and the third lower pads to each other;
   an encapsulant below the first semiconductor chip, the encapsulant sealing at least a portion of each of the second and third semiconductor chips, and covering side surfaces of the third lower pads; and
   bump structures below the encapsulant and the second and third semiconductor chips, and electrically connected to the second lower pads and the third lower pads.

2. The semiconductor device of claim 1, wherein the encapsulant covers an entirety of the side surfaces of the third lower pads.

3. The semiconductor device of claim 1, wherein the third semiconductor chip further comprises a lower insulating layer surrounding a lower portion of the dummy electrode structures and defining a lower surface of the third semiconductor chip.

4. The semiconductor device of claim 3, wherein the third lower pads protrude from the lower surface of the third semiconductor chip.

5. The semiconductor device of claim 3, wherein lower surfaces of the third lower pads are on a level lower than the lower surface of the third semiconductor chip.

6. The semiconductor device of claim 3, wherein the lower insulating layer comprises silicon oxide (SiO) or silicon carbonitride (SiCN).

7. The semiconductor device of claim 1, wherein the third upper pads and the third lower pads comprise at least one of copper (Cu), nickel (Ni), gold (Au), and silver (Ag).

8. The semiconductor device of claim 1, wherein the upper barrier layer and the lower barrier layer comprise at least one of titanium (Ti), titanium nitride (TiN), tantalum (Ta), and tantalum nitride (TaN).

9. The semiconductor device of claim 1, wherein each of the dummy electrode structures has a width greater than a width of each of the through electrodes.

10. The semiconductor device of claim 9, wherein the width of the dummy electrode structures is in a range of 1.5 to 2 times the width of each of the through electrodes.

11. The semiconductor device of claim 9, wherein the third upper pads have a width greater than a width of the second upper pads, and
    wherein the first pads of the second group have a width greater than a width of the first pads of the first group.

12. The semiconductor device of claim 1, wherein the third lower pads have a width greater than a width of the third upper pads, and
    wherein each of the dummy electrode structures includes a plurality of dummy electrodes connected to one of the third lower pads.

13. The semiconductor device of claim 12, wherein the plurality of dummy electrodes have a width narrower than a width of each of the through electrodes.

14. The semiconductor device of claim 12, wherein the plurality of dummy electrodes are connected to the third upper pads.

15. The semiconductor device of claim 14, wherein a plurality of third upper pads connected to the plurality of dummy electrodes among the third upper pads vertically overlap the one of the third lower pads.

16. The semiconductor device of claim 1, wherein the third semiconductor chip has a flat upper surface defined by upper surfaces of the third upper pads and an upper surface of the third insulating layer, and
    a sum of a planar area of each of the third upper pads is in a range of 5% to 25% of a planar area of the upper surface of the third semiconductor chip.

17. The semiconductor device of claim 1, wherein the first, second and third insulating layers comprise silicon oxide (SiO) or silicon carbonitride (SiCN).

18. The semiconductor device of claim 1, wherein the first semiconductor chip comprises a logic circuit, and
    wherein the second semiconductor chip comprises a cache memory circuit.

19. A semiconductor device, comprising:
    a first semiconductor chip including first pads and a first insulating layer surrounding the first pads, the first semiconductor chip having a flat lower surface defined by lower surfaces of the first pads and a lower surface of the first insulating layer;
    a second semiconductor chip below the first semiconductor chip, and including through electrodes electrically connected to a first group of the first pads, the second semiconductor chip having a flat upper surface in contact with the lower surface of the first semiconductor chip;
    a third semiconductor chip below the first semiconductor chip and spaced apart from the second semiconductor chip, and including dummy electrode structures electrically connected to a second group of the first pads, the third semiconductor chip having a flat upper surface in contact with the lower surface of the first semiconductor chip; and
    bump structures below the second and third semiconductor chips, and electrically connected to the through electrodes and the dummy electrode structures, the dummy electrode structures having a width in a first direction parallel to the flat lower surface of the first semiconductor chip which is greater than a width of the through electrodes in the first direction.

20. A semiconductor device, comprising:

a first semiconductor chip including first pads and a first insulating layer surrounding the first pads, the first semiconductor chip having a flat lower surface defined by lower surfaces of the first pads and a lower surface of the first insulating layer;

a second semiconductor chip below the first semiconductor chip, and including through electrodes electrically connected to a first group of the first pads, the second semiconductor chip having a flat upper surface in contact with the lower surface of the first semiconductor chip;

a third semiconductor chip below the first semiconductor chip and spaced apart from the second semiconductor chip, and including a plurality of dummy electrodes electrically connected to a second group of the first pads, the third semiconductor chip having a flat upper surface in contact with the lower surface of the first semiconductor chip; and bump structures below the second and third semiconductor chips, and electrically connected to the through electrodes and the plurality of dummy electrodes, wherein the third semiconductor chip further includes,
 a plurality of lower pads between the bump structures and the plurality of dummy electrodes, one of the plurality of lower pads connected to two or more dummy electrodes among the plurality of the dummy electrodes, and
 a plurality of upper pads between the plurality of the dummy electrodes and the second group of the first pads, two or more upper pads among the plurality of upper pads connected to the two or more dummy electrodes among the plurality of the dummy electrodes, and wherein each of the two or more upper pads is matched one to one with a corresponding one of the two or more dummy electrodes.

* * * * *